(12) United States Patent
Kitamura (10) Patent No.: US 8,330,151 B2
(45) Date of Patent: Dec. 11, 2012

(54) ORGANIC ELECTROLUMINESCENT ELEMENT

(75) Inventor: Yoshitaka Kitamura, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 221 days.

(21) Appl. No.: 12/878,091

(22) Filed: Sep. 9, 2010

(65) Prior Publication Data

US 2011/0068357 A1    Mar. 24, 2011

(30) Foreign Application Priority Data

Sep. 18, 2009 (JP) ................. 2009-217324

(51) Int. Cl.
*H01L 51/54* (2006.01)
*H01L 51/56* (2006.01)

(52) U.S. Cl. ............... 257/40; 257/88; 257/432

(58) Field of Classification Search ........... 257/40, 257/88–103, 431–448, E51.026, E51.019
See application file for complete search history.

(56) References Cited

U.S. PATENT DOCUMENTS

| | | | |
|---|---|---|---|
| 7,218,049 B2 | 5/2007 | Yamada et al. | |
| 2010/0171101 A1* | 7/2010 | Tanaka et al. | 257/40 |
| 2010/0252823 A1* | 10/2010 | Kambe et al. | 257/40 |
| 2010/0320481 A1* | 12/2010 | Kashiwabara | 257/88 |

FOREIGN PATENT DOCUMENTS

| | | |
|---|---|---|
| JP | 2007-207656 A | 8/2007 |
| JP | 4174989 B2 | 11/2008 |
| WO | WO 01/39554 A1 | 5/2001 |

* cited by examiner

*Primary Examiner* — Cuong Q Nguyen
(74) *Attorney, Agent, or Firm* — Birch, Stewart, Kolasch & Birch, LLP (57) ABSTRACT

The organic electroluminescent element of the present invention includes at least a pair of electrodes, at least one organic light-emitting layer between the pair of electrodes, and at least one lens A on a light-extracting surface of the pair of electrodes, wherein one of the pair of electrodes is a reflective electrode, and the other is a semi-transmissive/semi-reflective electrode, and wherein a real part $n_1$ of a refractive index of the organic light-emitting layer and a real part $n_2$ of a refractive index of the lens A satisfy the relationship $n_1 > n_2$, and the real part $n_2$ is represented by Expression (1) described below:

$$n_2 \leq n_3 \sin \theta_2 \quad \text{Expression (1).}$$

6 Claims, 3 Drawing Sheets

ORGANIC ELECTROLUMINESCENT ELEMENT

BACKGROUND OF THE INVENTION

1. Field of the Invention

The present invention relates to an organic electroluminescent element.

2. Description of the Related Art

Organic electroluminescent elements using an organic material are expected to be promising in applications such as inexpensive, full-color, wide flat-panel display devices of the solid luminescent type and writing light source arrays, and thus development of the elements has been carried out extensively. An organic luminescent element is generally composed of a light emitting layer, and a pair of opposing electrodes between which the light emitting layer is disposed. When an electric field is applied between the two electrodes, electrons are injected from the cathode and holes are injected from the anode. Luminescence (light emission) is a phenomenon in which energy is emitted in the form of light, when the electrons and the holes are recombined in the light emitting layer and the electrons return to the highest occupied molecular orbital from the lowest unoccupied molecular orbital.

Therefore, organic electroluminescent elements have an advantage in that they are used for display devices and illumination and can make such display devices lighter in weight and thinner in thickness. Organic electroluminescent elements have excellent characteristics as described above, however, generally, in an organic EL device using an organic electroluminescent element, a refractive index of each layer constituting the organic EL device is higher than a refractive index of air. For example, in an organic EL device using an organic electroluminescent element, a refractive index of an organic thin-film layer such as a light emitting layer is 1.6 to 2.1. Therefore, emitted light is totally reflected at an interface between layers with ease, and the light extraction efficiency is less than 20%, resulting in loss of most of the light.

For example, in a generally known organic EL device, an organic EL display unit includes a pair of electrode layers and an organic compound layer disposed between the pair of electrodes, on a substrate. The organic compound layer includes a light emitting layer, and the organic EL device emits light, which has been emitted from the light emitting layer, from a light extracting surface side thereof. In this case, a total reflection component, which is light having a critical angle, cannot be extracted at an interface between the organic compound layer and the light extracting surface or each electrode layer, and thus a problem arises that the light extraction efficiency is low.

For the reasons described above, there have been various organic EL devices proposed to improve the light extraction efficiency, including organic EL device, in which a light extraction member (e.g., lens) adapted to control an optical path of light emitted from a light emitting layer to cause the emitted light emerge outside the light extracting side is provided on the optical path; and organic EL devices in which the light extraction efficiency in the forward direction is improved by a fine resonator (microcavity) structure one of a pair of electrode layers sandwiching the light emitting layer is provided as a reflective electrode, and the other electrode is provided as a semi-transmissive/semi-reflective electrode.

For example, Japanese Patent Application Laid-Open (JP-A) No. 2007-207656 proposes an organic EL display device which includes an organic EL element having at least a light emitting layer between electrodes, and a transparent substrate disposed via a micro-lens layer on one surface side of the organic EL element, wherein the micro-lens layer includes a plurality of convex-shaped lens elements which are arrayed so as to form a plane, and a flattened layer which is formed so as to cover the convex-shaped lens elements, and wherein the refractive index of the convex-shaped lens elements is higher than that of the flattened layer.

In addition, there has been also known a method of improving the light extraction efficiency in a forward direction by a fine resonator (microcavity) structure in which one of a pair of electrodes sandwiching an organic compound layer is provided as a reflective electrode, and light emitted from a light emitting layer is caused to resonate by the other electrode (see Japanese Patent (JP-B) No. 4174989).

Lenses for use in these organic EL devices generally have a high refractive index equivalent to a refractive index of a light emitting layer for the purpose of improving the light extraction efficiency. However, a new problem arises that when such a lens having a high-refractive index is attached to a microcavity element, there is a significant difference in chromaticity between the case where a display device utilizing the organic EL device is viewed from the front side and the case where the display device is viewed in an oblique direction, and when the display device is viewed from an oblique direction, light having a component inferior in chromaticity is unfavorably contained.

BRIEF SUMMARY OF THE INVENTION

The present invention aims to solve the above-mentioned conventional problems and to achieve the following object. That is, an object of the present invention is to provide an organic electroluminescent element having high-light extraction efficiency and less viewing angle dependency of chromaticity.

The present inventors carried out extensive studies in an attempt to solve the above-mentioned problems, and have found the following finding. That is, the present inventors have found that from a viewing angle with respect to an organic electroluminescent element using a lens having a real part of a refractive index which is higher than the real part of a refractive index of an organic light-emitting layer constituting the organic electroluminescent element, a viewing angle, within which light having a chromaticity significantly different from that of light viewed from a perpendicular direction to the organic electroluminescent element when a perpendicular line is drawn from a light extracting surface of the organic electroluminescent element to the organic light-emitting layer is contained, is calculated, and then, from the calculated viewing angle, it is possible to select a lens having a real part of a refractive index, from which light having a chromaticity significantly different from that of light when the organic electroluminescent element is viewed from the perpendicular direction does not exit. Based on the finding described above, the present inventors have accomplished the present invention.

The present invention has been made based on the finding by the present inventors, and means for solving the above-mentioned problems are as follows:

<1> An organic electroluminescent element including:
  at least a pair of electrodes,
  at least one organic light-emitting layer between the pair of electrodes, and
  at least one lens A on a light-extracting surface of the pair of electrodes,
  wherein one of the pair of electrodes is a reflective electrode, and the other is a semi-transmissive/semi-reflective electrode, and wherein a real part $n_1$ of a refractive index of the organic light-emitting layer and a real part $n_2$ of a refractive index of the lens A satisfy the relationship $n_1 > n_2$, and the real part $n_2$ is represented by Expression (1) described below:

$$n_2 \leq n_3 \sin \theta_2 \qquad \text{Expression (1)}$$

in Expression (1), $n_3$ represents a real part of a refractive index of a lens B having a different refractive index from the lens A; $n_3$ and $n_1$ satisfy the relationship $n_{3>n1}$; and $\theta_2$ represents the smallest angle at which when the lens A in the organic electroluminescent element is replaced by the lens B, a perpendicular line is drawn from the light extracting surface to the organic light-emitting layer, light emerged from the organic light-emitting layer passes through the lens B at an angle of $\theta_3$ with respect to the perpendicular line, and a change in chromaticity ($\Delta u'v'$) between the angle of $\theta_3$ and the case where $\theta_3$ is equal to 0° on an u' v' chromaticity coordinate is represented by Expression (2) described below, the change in chromaticity ($\Delta u'v'$) is 0.1 or less.

$$\Delta u'v' = \sqrt{(u'(\theta_3) - u'(0))^2 + (v'(\theta_3) - v'(0))^2} \qquad \text{Expression (2)}$$

<2> The organic electroluminescent element according to <1> above, wherein when the smallest angle at which the change in chromaticity ($\Delta u'v'$) represented by Expression (2) is 0.05 or less is defined as $\theta_2$, the real part $n_2$ of the refractive index of the lens A is represented by Expression (1).

<3> The organic electroluminescent element according to one of <1> and <322 above, wherein when the smallest angle at which the change in chromaticity ($\Delta u'v'$) represented by Expression (2) is 0.02 or less is defined as $\theta_2$, the real part $n_2$ of the refractive index of the lens A is represented by Expression (1).

<4> The organic electroluminescent element according to any one of <1> to <322 above, wherein the real part $n_2$ of the refractive index of the lens A satisfies Expression (3) described below:

$$n_3 \sin \theta_2 - 0.1 \leq n_2 \leq n_3 \sin \theta_2 \qquad \text{Expression (3)}$$

<5> An organic electroluminescent element including:
at least a pair of electrodes,
at least one organic light-emitting layer between the pair of electrodes, and
at least one lens A on a light-extracting surface of the pair of electrodes,
wherein one of the pair of electrodes is a reflective electrode, and the other is a semi-transmissive/semi-reflective electrode, and
wherein a real part $n_1$ of a refractive index of the organic light-emitting layer and a real part $n_2$ of a refractive index of the lens A satisfy the relationship $n_1 > n_2$, and the real part $n_2$ is represented by Expression (1)' described below:

$$n_2 \leq n_3 \sin \theta_4 \qquad \text{Expression (1)'}$$

in Expression (1)' $n_3$ represents a real part of a refractive index of a lens B having a different refractive index from the lens A; $n_3$ and $n_1$ satisfy the relationship $n_3 > n_1$; and $\theta_4$ represents an angle obtained when the lens A in the organic electroluminescent element is replaced by the lens B, a perpendicular line is drawn from the light extracting surface to the organic light-emitting layer, light emerged from the organic light-emitting layer passes through the lens B at an angle of $\theta_3$ with respect to the perpendicular line, a change in chromaticity ($\Delta u'v'$) between the angle of $\theta_3$ and the case where $\theta_3$ is equal to 0° on an u' v' chromaticity coordinate is represented by Expression (2) described below, and an angle at which a differential value when the change in chromaticity ($\Delta u'v'$) is differentiated with respect to $\theta_3$ $d(\Delta u'v')/d\theta_3$ is equal to zero is defined as $\theta_B$, and $\theta_4$ has the same value as the change in chromaticity corresponding to $\theta_B$ and has a large value next to $\theta_B$.

$$\Delta u'v' = \sqrt{(u'(\theta_3) - u'(0))^2 + (v'(\theta_3) - v'(0))^2} \qquad \text{Expression (2)}$$

<6> The organic electroluminescent element according to <5> above, wherein the real part $n_2$ of the refractive index of the lens A satisfies Expression (3)' described below:

$$n_3 \sin \theta_4 - 0.1 \leq n_2 \leq n_3 \sin \theta_4 \qquad \text{Expression (3)'}$$

<7> The organic electroluminescent element according to any one of <1> to <6>, wherein when a distance between the pair of electrodes is represented by "d", a range of wavelengths about the peak intensity of light emitted from the organic light-emitting layer ±20 nm is represented by λ, and a phase shift of light reflected between the pair of electrodes is represented by φ, the distance d, the range of wavelengths λ and the phase shift φ satisfy Expression (4) described below and the relationship $m \geq 2$:

$$m = \frac{2d}{\lambda} + \frac{\phi}{2\pi} \qquad \text{Expression (4)}$$

in Expression (4), "m" is an integer.

According to the present invention, it is possible to solve the above-mentioned conventional problems, to achieve the object and to provide an organic electroluminescent element having high-light extracting efficiency and less viewing angle dependency of chromaticity.

DETAILED DESCRIPTION OF THE INVENTION (Organic Electroluminescent Element)

The organic electroluminescent element of the present invention includes at least a pair of electrodes composed of an anode and a cathode, an organic compound layer having at least one organic light-emitting layer between the pair of electrodes, and at least one lens on a light extracting surface of the pair of electrodes, includes a substrate and a barrier layer, and may further include other members as required.

The organic compound layer preferably includes, for example, a hole transport layer, an organic light-emitting layer, an electron transport layer and the like, and preferably takes, as a structure of the laminated layers, for example, an aspect in which these layers are laminated in the order described above from the anode size. Further, it is preferable to provide a hole injection layer between the hole transport layer and the anode, and/or an electron injection layer between the cathode and the electron transport layer. In addition, an electron blocking layer may be provided between the organic light-emitting layer and the electron transport layer, and/or a hole blocking layer may be provided between the organic light-emitting layer and the hole transport layer. Note that each of the above-mentioned layers may be divided into plural secondary layers.

<Microcavity Structure>

The organic electroluminescent element forms a microcavity (fine resonator) structure in which a reflective electrode reflecting light emitted from the organic light-emitting layer is disposed as one electrode, a semi-transmissive/semi-reflective electrode is disposed as the other electrode, and an organic compound layer having at least one organic light-emitting layer between these electrodes is disposed. The organic electroluminescent element repeats reflection-interference between both of the electrodes by the microcavity structure. It is preferable in that the color intensity is increased by multiple interference, and an organic electroluminescent element capable of emitting light having higher light intensity can be obtained.

In the microcavity structure, effective refractive indices of both of the electrodes, a refractive index of the organic compound layer provided between both of the electrodes and an optical path length determined by the thickness of the organic compound layer are adjusted so as to be optimal values.

Note that in place of the reflective electrode, a combination of an optically transmissive electrode with a multilayer film mirror or the like can also be used.

Here, in the organic electroluminescent element of the present invention, when a distance between the pair of electrodes, i.e., a distance between the anode and the cathode, sandwiching the organic compound layer therebetween, is defined as "d", a peak of light emitted from the organic light-emitting layer is defined as "λ" and a phase shift of reflection light reflected by the pair of electrodes is defined as "ϕ", the following Expression (4) is satisfied.

$$m = \frac{2d}{\lambda} + \frac{\phi}{2\pi} \qquad \text{Expression (4)}$$

In Expression (4), "m" is an integer.

When "m" is equal to 1, the microcavity structure is a primary structure, and when "m" is equal to 2, the microcavity structure is a secondary structure.

The description "the microcavity structure is a primary structure" means that the optical path length of the structure is the shortest path length satisfying the conditions where the optical path length is 1λ (λ represents a wavelength of emitted light) and light components round-tripping between the pair of electrodes intensify each other.

The description "the microcavity structure is a secondary structure" means that the optical path length of the structure is an optical path length which is second shortest next to the shortest optical path length (i.e., the second shortest path length) satisfying the conditions where the optical path length is 2λ (λ represents a wavelength of emitted light) and light components round-tripping between the pair of electrodes intensify each other.

Among the above-mentioned, it is preferable that the organic electroluminescent element satisfy the relationship $m \geq 2$ in that the film thickness is increased to prevent short-out, and a sharp emission of light in a forward direction with respect to the organic electroluminescent element can be obtained.

<Light Extracting Method>

The organic electroluminescent element may be of a so-called bottom emission type or may be of a so-called top emission type.

<<Bottom Emission Type>>

When the organic electroluminescent element is of bottom emission type, the reflective electrode is disposed at the side opposite to the substrate when viewed from the organic electroluminescent element, and the semi-transmissive/semi-reflective electrode is disposed at the same side of the substrate when viewed from the organic electroluminescent element. With this arrangement, light emitted from the organic light-emitting layer passes through the semi-transmissive/semi-reflective electrode and exits from the organic electroluminescent element, with the substrate side surface serving as a light extracting surface.

<<Top Emission Type>>

When the organic electroluminescent element is of top emission type, the reflective electrode, which reflects light emitted from the organic light-emitting layer, is disposed at the same side of the substrate when viewed from the organic electroluminescent element, and the semi-transmissive/semi-reflective electrode is disposed at the side opposite to the substrate when viewed from the organic electroluminescent element. With this arrangement, light emitted from the organic light-emitting layer passes through the semi-transmissive/semi-reflective electrode and exits from the organic electroluminescent element, with the surface side thereof opposite to the substrate serving as a light extracting surface.

Here, a direction from which light emitted from the organic light-emitting layer finally exits outside from a desired surface of the organic electroluminescent element may be referred to as "light exit direction".

<Electrode>

In the pair of electrodes, one is a reflective electrode, and the other is a semi-transmissive/semi-reflective electrode.

The one pair of electrodes is not particularly limited, as long as it is capable of applying an electric filed to the organic light-emitting layer, and may be suitably selected according to the arrangement the electrodes in the organic electroluminescent element. Note that organic electroluminescent element has a semi-transmissive/semi-reflective electrode along the light exit direction of light emitted from the organic light-emitting layer.

In the present invention, the reflective electrode may further have optical transmissivity.

<<Anode>>

The anode is not particularly limited, as long as it is generally sufficient to function as an electrode to supply holes to the organic compound layer having an organic light-emitting layer, and the anode may be arbitrarily selected from known materials of electrode in accordance with the intended use and application purpose of the organic electroluminescent element. For example, the after-mentioned materials are exemplified.

The shape, structure, and size of the anode are also not particularly limited, and may be suitably selected in accordance with the intended use.

Preferred examples of the material of the anode include metals, alloys, electrically conductive compounds and mixtures of these materials.

Specific examples of the material of the anode include tin oxides doped with antimony, fluorine, etc. (ATO, FTO); electrically conductive metal oxides such as tin oxide, zinc oxide, indium oxide, indium tin oxide (ITO), and indium zinc oxide (IZO); metals such as gold, silver, chromium, and nickel, mixtures and laminates of these metals with electrically conductive metal oxides; inorganic electrically conductive materials such as copper iodide, and copper sulfide; organic electrically conductive materials such as polyaniline, polythiophene, and polypyrrole, and laminates of these organic electrically conductive materials with ITO, etc. These materials may be used alone or in combination. When an anode does not have reflecting properties, it is necessary to use a reflective material or a dielectric multilayer film in combination.

The thickness of the anode can be suitably selected depending on the material constituting the anode. It is, however, usually about 10 nm to about 50 µm, and preferably 50 nm to 20 µm.

When light is extracted from the anode, the thickness of the reflective material is preferably 10 nm to 50 nm.

The method of forming the anode is not particularly limited, and may be arbitrarily selected, taking the suitability with the material constituting the anode into consideration. Examples of the forming method include known methods such as wet-process methods (e.g., a printing method, and a coating method); physical methods (e.g., a vacuum vapor deposition method, a sputtering method, and an ion-plating method); and chemical methods (e.g., a CVD method, and a plasma CVD method).

In the organic electroluminescent element, the position of the anode to be formed is not particularly limited, as long as it is provided so that it can supply holes to the organic light-emitting layer, and may be suitably selected in accordance with the intended use and application purpose of the organic electroluminescent element. The anode may be formed on the entire surface of one side of the organic light-emitting layer or may be formed at a part of the one surface of the organic light-emitting layer.

In the formation of the anode, patterning of the anode may be carried out by chemical etching such as photo-lithography, may be carried out by physical etching with use of a laser, etc., may be carried out by vacuum vapor deposition or sputtering on a superposed mask, or a lift-off method or a printing method may be used. The value of resistance of the anode is not particularly limited and may be suitably selected in accordance with the intended use. For example, it is preferably $10^3$ Ω/square or lower, and more preferably $10^2$ Ω/square or lower.

The anode may be optically transmissive or non-transmissive, however, the anode is the side of a light extracting surface from which light emitted from the organic light-emitting layer is extracted, the anode is preferably optically transmissive. When the anode is optically transmissive, it may be color-less and transmissive, or may be colored and transmissive.

When the anode is optically transmissive, the transmittance of the optically transmissive electrode is not particularly limited, as long as it can make the light emitted from the organic light-emitting layer outgo, and may be suitably selected in accordance with the intended use.

Further, when the anode is optically transmissive, it is preferable to use an electrode having a reflectance exceeding 10% as viewed from the organic light-emitting layer. When the reflectance is 10% or lower, a microcavity structure may not be formed.

In connection with optically transmissive anodes, detailed description is found in Yutaka Sawada supervised "*Tomei Denkyoku-Maku no Shintenkai* (New Developments of Transparent Electroconductive Films)" CMC Publishing Co., Ltd. (1999), and the description therein can be applied to the present invention.

<<Cathode>>

The cathode is not particularly limited, as long as it is generally sufficient to function as an electrode to inject electrons to the organic compound layer having an organic light-emitting layer, and the cathode may be arbitrarily selected from known materials of electrode in accordance with the intended use and application purpose of the organic electroluminescent element. For example, the after-mentioned materials are exemplified. The shape, structure and size of the cathode are not particularly limited, and these can be arbitrarily selected from known materials of electrode in accordance with the intended use and purpose of the light emitting element.

The shape, structure, and size of the cathode are also not particularly limited, and may be suitably selected in accordance with the intended use.

Examples of material constituting the cathode include metals, alloys, metal oxides, electrically conductive compounds and mixtures of these materials.

Specific examples of the material of the cathode include alkali metals (e.g., Li, Na, K, Cs, etc.), alkaline earth metals (e.g., Mg, Ca, etc.), and rare earth metals (e.g., gold, silver, lead, aluminum, sodium-potassium alloy, lithium-aluminum alloy, magnesium-silver alloy, indium, and ytterbium). These materials may be used alone, however, from the viewpoint of simultaneous achievement of stability and electron injection properties, two or more materials are preferably used in combination.

Among these, as the material constituting the cathode, alkali metals and alkaline earth metals are preferred in terms of the electron injecting properties, and materials mainly containing lithium and/or aluminum are preferred for their excellent storage stability. Examples of the materials mainly containing aluminum include single use of aluminum, an alloy of aluminum with 0.01% by mass to 10% by mass of an alkali metal or alkali rare metal, or a mixture thereof (e.g., an lithium-aluminum alloy, and a magnesium-aluminum alloy).

Note that detailed description of materials of the cathode is found in JP-A Nos. 02-15595, and 05-121172, and thee materials described therein can be applied to the present invention.

The thickness of the cathode can be suitably selected depending on the material constituting the cathode. It is, however, usually about 10 nm to about 5 µm, and preferably 50 nm to 1 µm.

Then light is extracted from the cathode, the thickness of the reflective material is preferably 10 nm to 50 nm.

The method of forming the cathode is not particularly limited, and may be arbitrarily selected, taking the suitability with the material constituting the cathode into consideration. Examples of the forming method include known methods such as wet-process methods (e.g., a printing method, and a coating method); physical methods (e.g., a vacuum vapor deposition method, a sputtering method, and an ion-plating method); and chemical methods (e.g., a CVD method, and a plasma CVD method). For example, in the case of selecting metals as the materials of the cathode, the cathode can be formed with one or two or more kinds of the materials at the same time or in order by a sputtering method.

In the organic electroluminescent element, the position of the cathode to be formed is not particularly limited, as long as it can be provided so that an electric field can be applied to the organic light-emitting layer, and may be suitably selected in accordance with the intended use and application purpose of the organic electroluminescent element.

The cathode may be formed on the entire surface of one side of the organic light-emitting layer or may be formed at a part of the one surface of the organic light-emitting layer.

In the formation of the cathode, patterning of the cathode may be carried out by chemical etching such as photo-lithography, may be carried out by physical etching with use of a laser, etc., may be carried out by vacuum vapor deposition or sputtering on a superposed mask, or a lift-off method or a printing method may be used.

A dielectric layer composed of fluoride or oxide of alkali metal or alkaline earth metal may be inserted between the cathode and the organic compound layer in a thickness of from 0.1 nm to 5 nm. The dielectric layer can be regarded as a kind of an electron-injecting layer. The dielectric layer can be formed by, for example, a vacuum deposition method, a sputtering method, an ion plating method, etc.

The cathode may be optically transmissive or non-transmissive, however, the cathode is the side of a light extracting surface from which light emitted from the organic light-emitting layer is extracted, the cathode is preferably optically transmissive. When the cathode is optically transmissive, it may be color-less and transmissive, or may be colored and transmissive.

When the cathode is optically transmissive, the transmittance of the optically transmissive electrode is not particularly limited, as long as it can make the light emitted from the organic light-emitting layer outgo, and may be suitably selected in accordance with the intended use.

Further, when the cathode is optically transmissive, it is preferable to use an electrode having a reflectance exceeding 10% as viewed from the organic light-emitting layer. When the reflectance is 10% or lower, a microcavity structure may not be formed.

Note that the optically transmissive cathode can be formed by thinly forming the above-mentioned material of the cathode in a thickness of 1 nm to 10 nm and further stacking thereon a transparent and electrically conductive material (e.g., ITO and IZO).

<Organic Compound Layer>

The organic compound layer includes at least one organic light-emitting layer and if required, includes a hole transport layer, an electron transport layer, a hole blocking layer, an electron blocking layer, a hole injection layer, an electron injection layer, and the like.

<<Organic Light-Emitting Layer>>

The organic light-emitting layer is a layer which is provided between the pair of electrodes and emits light by applying an electric field thereto.

The material of the organic light-emitting layer is not particularly limited, as long as it is capable of forming a layer having functions to receive, at the time of electric field application, holes from the anode, hole injection layer or hole transport layer, and to receive electrons from the cathode, electron injection layer or electron transport layer, a function to move the received charge and a function to offer the field of recombination of holes and electrons to emit light, and may be suitably selected in accordance with the intended use.

Examples of the materials of the organic light-emitting layer include various metal complexes as typified by a metal complex or rare earth complex of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, aromatic dimethylidine compound or 8-quinolinol derivatives; and a polymer compound such as polythiophene, polyphenylene and polyphenylene-vinylene.

The thickness of the organic light-emitting layer is not particularly limited and may be suitably selected in accordance with the intended use. The thickness is, however, preferably from 1 nm to 5 µm, more preferably from 5 nm to 1 µm, still more preferably from 10 nm to 500 nm.

The method of forming the organic light-emitting layer is not particularly limited, and may be suitably selected in accordance with the intended use. Examples of the method include a resistance heating vapor deposition method, an electron beam method, a sputtering method, a molecular lamination method, a coating method (e.g., spin coating, casting, and dip coating) and an LB method.

-Charge Generating Layer-

The organic electroluminescent element of the invention can take a structure in which a charge generating layer is provided between a plurality of light emitting layers for improving luminous efficiency.

The charge generating layer has functions of generating charge (holes and electrons) at the time of application of electric field and injecting the generated charge to the layer contiguous to the charge-generating layer.

The material constituting the charge generating layer is not particularly limited, as long as it has the above-mentioned functions, and may be suitably selected in accordance with the intended use. The charge generating layer may be formed with a single compound or a plurality of compounds.

Specifically, the material may be a material having conductivity, may be a material having semi-conductivity such as a doped organic layer, or may be a material having an electric insulating property, and examples of the materials include disclosed in Japanese Patent Application Laid-Open (JP-A) Nos. 11-329748, 2003-272860, and 2004-39617.

More specifically, transparent conductive materials such as ITO and IZO (indium zinc oxide), Fullerenes such as C60, conductive organic materials such as oligothiophene, conductive organic materials such as metallic phthalocyanines, metal-free phthalocyanines, metallic porphyrins, and metal-free porphyrins, metallic materials such as Ca, Ag, Al, Mg:Ag alloy, Al:Li alloy, and Mg:Li alloy, hole-conductive materials, electron-conductive materials, and mixtures of these materials may be used.

As the hole-conductive materials, for example, materials obtained by doping oxidants having an electron-withdrawing property such as F4-TCNQ, [2,3,5,6-tetrafluoro-7,7,8,8-tetracyanoquinodimethane], TCNQ, and FeCl$_3$ to hole-transporting organic materials such as 2-TNATA [4,4',4"-tris[2-naphthyl(phenyl)amino]triphenylamine], and NPD [4,4'-bis[N-(1-naphtyl)-N-phenyl-amino]biphenyl]; P-type conductive polymers, and P-type semiconductors are exemplified. As the electron-conductive materials, for example, materials obtained by doping metals or metallic compounds having a work function of less than 4.0 eV to electron-transporting organic materials, N-type conductive polymers, and N-type semiconductors are exemplified. As the N-type semiconductors, N-type Si, N-type CdS, and N-type ZnS are exemplified. As the P-type semiconductors, P-type Si, P-type CdTe, and P-type CuO are exemplified.

Further, an electrically insulating material such as V$_2$O$_5$ can also be used as the charge-generating layer.

The charge generation layer may take a single-layer structure containing one or two or more of the above-mentioned materials, or a multilayer structure composed of plural layers of a homogeneous composition or a heterogeneous composition. Examples of the multilayer structure include a laminate structure in which a material having conductivity (e.g., a transparent conductive material, and a metal material) and a hole conductive material or an electron conductive material are laminated; and a layer having a laminate structure in which the above-mentioned hole conductive material and electron conductive material are laminated.

Generally, the film thickness and the material of the charge generating layer are preferably selected so that the transmittance of visible light is 50% or higher. The film thickness is not particularly limited and may be suitably selected in accordance with the intended use. It is, however, preferably 0.5 nm to 200 nm, more preferably 1 nm to 100 nm, still more preferably 3 nm to 50 nm, and particularly preferably 5 nm to 30 nm.

The method of forming the charge generating layer is not particularly limited and may be suitably selected in accordance with the intended use. Examples thereof include the forming method of the organic compound layer described above.

The charge generating layer is formed between each two layers of a plurality of light emitting layers, and the anode side and the cathode side of the charge generating layer may contain materials having a function of injecting charge to the contiguous layers. For improving an electron injecting property to the layer contiguous to the anode side, electron injecting compounds such as BaO, SrO, Li$_2$O, LiCl, LiF, MgF$_2$, MgO, CaF$_2$ may be laminated on the anode side of the charge generating layer.

Besides the above description, the materials of the charge generating layer can be selected with reference to Japanese Patent Application Laid-Open (JP-A) No. 2003-45676, U.S. Pat. Nos. 6,337,492, 6,107,734, and 6,872,472.

-Refractive Index-

The refractive index of the organic light-emitting layer may be suitably selected, however, when a real part of the refractive index of the organic light-emitting layer is defined as n$_1$, and a real part of the refractive index of the after-mentioned lens A is defined as n$_2$, the relationship of n$_1$>n$_2$ is satisfied.

<<Hole Injection Layer and Hole Transport Layer>>

The hole injection layer and the hole transport layer are layers functioning to receive holes from an anode or from an anode side and to transport the holes to a cathode side. A hole injection material and a hole transporting material for use in these layers may be low-molecular weight compounds or high-molecular weight compounds.

Examples of the materials for use in the hole injection layer and the hole transport layer include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers; and conductive polymeric oligomers such as thiophene oligomers, and polythiophene.

An electron-accepting dopant may be introduced into the hole injection layer or the hole transport layer in the organic electroluminescent element of the present invention. As the electron-accepting dopant to be introduced into a hole injection layer or a hole transport layer, either or both of an inorganic compound or an organic compound may be used as long as the compound has electron accepting property and a property for oxidizing an organic compound.

Specific examples of the inorganic compound include metal halides (e.g., iron (II) chloride, aluminum chloride, gallium chloride, indium chloride and antimony pentachloride); and metal oxides (e.g., vanadium pentaoxide, and molybdenum trioxide).

In the case of employing the organic compounds, compounds having a substituent such as a nitro group, a halogen, a cyano group, a trifluoromethyl group or the like; quinone compounds; acid anhydride compounds; fullerenes; and the like may be preferably applied.

Besides the above compounds, it is possible to favorably use compounds described in patent documents such as Japanese Patent Application Laid-Open (JP-A) Nos. 06-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, and 2005-209643.

Among these compounds, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalone, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferable, and tetrafluorotetracyanoquinodimethane is particularly preferable.

The hole injection layer and hole transport layer may take a single layer structure containing one or two or more of the above-mentioned materials, or a multilayer structure composed of plural layers of a homogeneous composition or a heterogeneous composition.

These electron-accepting dopants may be used alone or in a combination. An applied amount of these electron-accepting dopants differs depending on the type of material, but it is preferably 0.01% by mass to 50% by mass with respect to a hole transport layer material, more preferably 0.05% by mass to 20% by mass, and particularly preferably 0.1% by mass to 10% by mass.

The thickness of the hole injection layer and the thickness of the hole transport layer are each preferably 500 nm or less, from the viewpoint of reducing driving voltage.

The thickness of the hole transport layer is preferably 1 nm to 500 nm, more preferably 5 nm to 200 nm, and still more preferably 10 nm to 100 nm.

The thickness of the hole injection layer is preferably 0.1 nm to 200 nm, more preferably 0.5 nm to 100 nm, and still more preferably 1 nm to 100 nm.

The method of forming the hole injection layer and hole transport layer is not particularly limited, and may be suitably selected in accordance with the intended use. Examples of the method include a vapor deposition method, an LB method, a coating method after the hole injection or transport material is dissolved or dispersed in a solvent (e.g., spin coating, casting, and dip coating). In the case of a coating method, the above-described hole injection/transport material can be dissolved or dispersed together with resin components in the solvent.

The resin component is not particularly limited and may be suitably selected in accordance with the intended use. Examples of the resin component include polyvinyl chloride, polycarbonate, polystyrene, polymethyl methacrylate, polybutyl methacrylate, polyester resin, polysulfone resin, polyphenylene oxide resin, polybutadiene, poly(N-vinylcarbazole) resin, hydrocarbon resin, ketone resin, phenoxy resin, polyamide resin, ethyl cellulose, vinyl acetate resin, ABS resin, polyurethane resin, melamine resin, unsaturated polyester resin, alkyd resin, epoxy resin and silicone resin. These may be used alone or in combination.

<<Electron Injection Layer and Electron Transport Layer>>

The electron injection layer and the electron transport layer are layers having functions of receiving electrons from a cathode or from a cathode side, and transporting electrons to an anode side. An electron injection material and an electron transporting material for use in these layers may be low-molecular weight compounds or high-molecular weight compounds.

Examples of the material for use in the electron injection layer and electron transport layer include various metal complexes as typified by a metal complex of triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidene methane derivatives, distyrylpyrazine derivatives, heterocyclic tetracarboxylic acid anhydride (e.g., naphthalene perylene), phthalocyanine derivatives or 8-quinolinol derivatives, and a metal complex in which the ligand is metal phthalocyanine, benzoxazole or benzothiazole. These may be used alone or in combination.

The electron injection layer or the electron transport layer in the organic electroluminescent element of the present invention may contain an electron donating dopant. As the electron donating dopant to be introduced in the electron injection layer or the electron transport layer, any material may be used as long as it has an electron-donating property and a property for reducing an organic compound, and alkaline metals such as Li, alkaline earth metals such as Mg, transition metals including rare-earth metals, and reducing organic compounds are preferably used. Specific examples of the metals include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds.

Besides the above materials, it is possible to use materials described in Japanese Patent Application Laid-Open (JP-A) Nos. 06-212153, 2000-196140, 2003-68468, 2003-229278, 2004-342614, and the like.

The electron injection layer and electron transport layer may take a single layer structure containing one or two or more of the above-mentioned materials, or a multilayer structure composed of plural layers of a homogeneous composition or a heterogeneous composition.

These electron donating dopants may be used alone or in combination. An applied amount of the electron donating dopants differs dependent on the types of the materials, but it is preferably from 0.1% by mass to 99% by mass with respect to an electron transport layer material, more preferably from 1.0% by mass to 80% by mass, and particularly preferably from 2.0% by mass to 70% by mass.

The thickness of the electron injection layer and the thickness of the electron transport layer are each preferably 500 nm or less from the viewpoint of reducing driving voltage.

The thickness of the electron transport layer is preferably from 1 nm to 500 nm, more preferably from 5 nm to 200 nm, and particularly preferably 10 nm to 100 nm.

The thickness of the electron injection layer is preferably from 0.1 nm to 200 nm, more preferably from 0.2 nm to 100 nm, and particularly preferably from 0.5 nm to 50 nm.

The method of forming the electron injection layer and electron transport layer is not particularly limited, and may be suitably selected in accordance with the intended use. Examples of the method include a vapor deposition method, an LB method, a coating method after the electron injection or transport material is dissolved or dispersed in a solvent (e.g., spin coating, casting, and dip coating). In the case of a coating method, the above-described electron injection/transport material can be dissolved or dispersed together with resin components in the solvent. As the resin components, those exemplified for the hole injection and transport layers can be used.

<<Hole Blocking Layer>>

The hole blocking layer is a layer having a function to prevent holes transported from the anode side to the light emitting layer from passing through the cathode side. The hole blocking layer can be provided as an organic compound layer contiguous to the light emitting layer on the cathode side.

The compound constituting the hole blocking layer is not particularly limited and may be suitably selected in accordance with the intended use. Examples thereof include aluminum complexes such as BAlq [Aluminum(III)bis(2-methyl-8-quinolinato)-4-phenylphenolate], triazole derivatives, and phenanthroline derivatives such as BCP [2,9-dimethyl-4,7-diphenyl-1,10-phenanthroline].

The hole blocking layer may take a single-layer structure containing one or two or more of the above-mentioned materials, or a multilayer structure composed of plural layers of a homogeneous composition or a heterogeneous composition.

The thickness of the hole blocking layer is not particularly limited and may be suitably selected in accordance with the intended use. It is, however, preferably from 1 nm to 500 nm, more preferably from 5 nm to 200 nm, and particularly preferably from 10 nm to 100 nm.

<<Electron Blocking Layer>>

The electron blocking layer is a layer having a function to prevent electrons transported from the cathode side to the light emitting layer from passing through the anode side. In the present invention, the electron blocking layer can be provided as an organic compound layer contiguous to the light emitting layer on the anode side.

A compound constituting the electron blocking layer is not particularly limited and may be suitably selected in accordance with the intended use. For example, those exemplified as hole transporting materials above can be used.

The electron blocking layer may take a single layer structure containing one or two or more of the above-mentioned materials, or a multilayer structure composed of plural layers of a homogeneous composition or a heterogeneous composition.

The thickness of the electron blocking layer is not particularly limited and may be suitably selected in accordance with the intended use. It is, however, preferably from 1 nm to 500 nm, more preferably from 5 nm to 200 nm, and particularly preferably from 10 nm to 100 nm.

<Lens>

The lens is provided on the light extracting surface of the organic electroluminescent element and has a function to control an optical path of light emitted from the organic light-emitting layer. By providing the lens on the light extracting surface, the light extracting efficiency of the front surface luminance is improved, and the brightness of the organic electroluminescent element as viewed from a perpendicular line which is drawn from the light extracting surface to the organic light-emitting layer thereof is improved.

Examples of the light extracting surface include a glass substrate (in the case of bottom emission type), and a barrier layer (in the case of top emission type).

The shape, array and size of the lens are not particularly limited and may be suitably selected in accordance with the intended use. As the shape, a convex lens is preferable. Besides, a semi-spherical trapezoid-shape, a shape obtained by cutting half a sphere, and a shape obtained by cutting an ellipsoidal body, etc. are exemplified. Among these, a semi-spherical shaped lens is particularly preferable in terms of the improvement rate of front-surface luminance.

Examples of the array of the lens include a square-lattice form and a honeycomb form.

As the size of the lens, it is preferable to use a lens greater in size than pixels of the organic electroluminescent element. In the case of a semi-spherical shaped lens, the effective diameter is preferably 10 μm to 1,000 μm, and more preferably 20 μm to 100 μm.

The material of the lens is not particularly limited, as long as, it is a lens satisfying the after-mentioned real part of a refractive index $n_2$, and may be suitably selected in accordance with the intended use.

The method of forming the lens is not particularly limited and may be suitably selected in accordance with the intended use. Examples thereof include a grinding method, an etching method, an inkjet method, an imprinting method, and a photolithographic method.

In the imprinting method, for example, a composition containing a releasing agent and an UV-curable resin is applied onto a transparent mold, and thereafter the transparent mold is pressure-bonded on an organic EL element and subjected to irradiation of UV ray, followed by releasing the mold from the organic EL element, whereby a lens can be formed on the organic EL element.

<<Refractive Index>>

A lens (otherwise referred to hereinafter as "lens A") for use in the organic electroluminescent element is a lens having a real part $n_2$ of refractive index calculated in relation to a real part $n_1$ of refractive index of the organic light-emitting layer.

Figure 1:
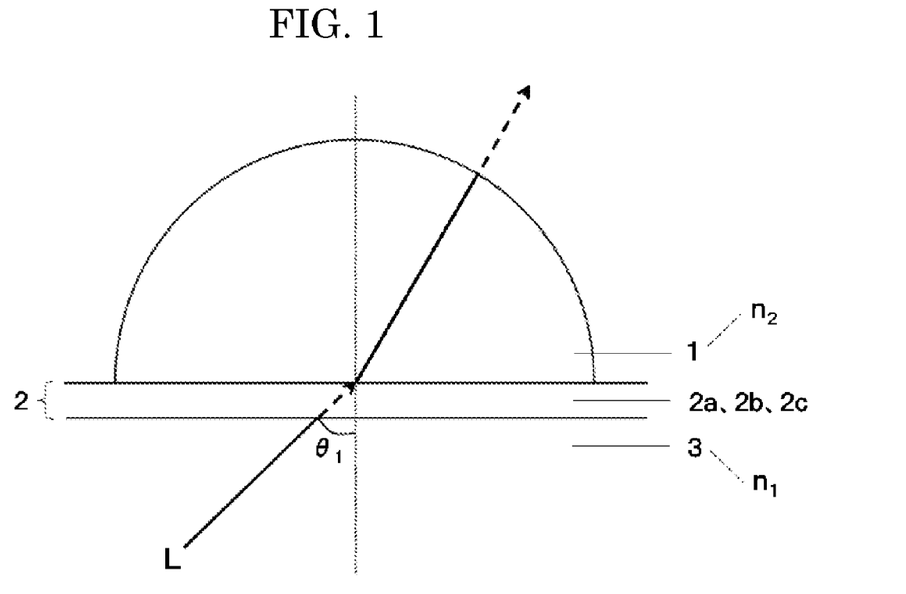
FIG. 1 is a schematic diagram exemplarily illustrating a relationship between a real part $n_2$ of refractive index of a lens and a real part $n_2$ of refractive index of an organic light-emitting layer in an organic electroluminescent element according to the present invention.

More specifically, as illustrated in FIG. 1, a real part of a refractive index of an organic light-emitting layer 3 is represented by $n_1$, and a real part of a refractive index of a lens A1 is represented by $n_2$ ($n_1 > n_2$). The value of $n_2$ can be determined as follows.

Figure 2:
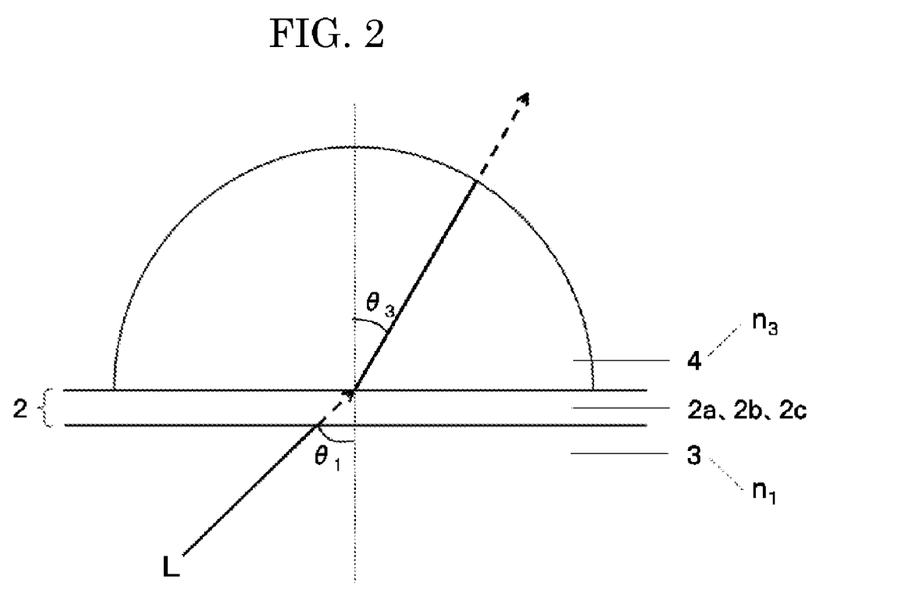
FIG. 2 is a schematic diagram exemplarily illustrating a relationship between a real part $n_3$ of refractive index of a lens, which has a different refractive index from the lens having a real part $n_2$ of refractive index, and a real part $n_1$ of refractive index of the organic light-emitting layer, for calculating the real part $n_2$ of refractive index of the lens in an organic electroluminescent element according to the present invention.

As illustrated in FIG. 2, a lens 4 (otherwise hereinafter referred to as "lens B") having a value greater in real part of a refractive index $n_3$ ($n_3 > n_1$) than the organic light-emitting layer 3 is used instead of the lens A1. Light L emitted from the organic light-emitting layer 3 passes through a lens B4 and then is emerged therefrom. Here, inside the lens B4, light L is emerged at an angle $\theta_3$ with respect to a perpendicular line drawn from the light emitting surface to the organic light-emitting layer 3.

Note that the organic electroluminescent elements illustrated in FIGS. 1 and 2 each have a laminate structure 2 which includes at least a pair of electrodes 2b between the organic light-emitting layer 3 and the lens A1 or lens B4, at least one organic layer 2a between the electrodes 2b, and a substrate 2c, however, the structure of the organic electroluminescent element of the present invention is not limited to this structure.

A chromaticity of light L emitted at an angle of $\theta_3$ to the perpendicular line is differentiated with respect to a chromaticity of light L obtained when the angle $\theta_3$ is equal to zero ($\theta_3 = 0$), and a change in chromaticity ($\Delta u'v'$) of light L is obtained. Then, the change in chromaticity ($\Delta u'v'$) of light L is represented by the following Expression (2), and $\theta_3$ is plotted along the horizontal axis and the change in chromaticity ($\Delta u'v'$) is plotted along the vertical axis to obtain a graph. From the plotted graph, an angle $\theta_2$, which is the smallest angle, at which the change in chromaticity ($\Delta u'v'$) is 0.1 or less, is determined, and the angle $\theta_2$ can be determined by the following Expression (1).

The value of the change in chromaticity ($\Delta u'v'$) is preferably 0.05 or less, and more preferably 0.02 or less.

Here, a change of the angle $\theta_3$ from 0° to 90° may be obtained from 0° to +90° or may be obtained from 0° to −90°.

Hereinbelow, the case where the smallest angle, at which the change in chromaticity ($\Delta u'v'$) is 0.1 or less, is defined as $\theta_2$ may be referred to as a "first aspect"; the case where the smallest angle, at which the change in chromaticity ($\Delta u'v'$) is 0.05 or less, is defined as $\theta_2$ may be referred to as a "second aspect"; and the case where the smallest angle, at which the change in chromaticity ($\Delta u'v'$) is 0.02 or less, is defined as $\theta_2$ may be referred to as a "third aspect".

In the first, second and third aspects, the lens A1 is not particularly limited, as long as the value of $n_2$ can be represented by the following Expression (1), and may be suitably selected in accordance with the intended use. It is, however, preferable to use a lens having $n_2$ within the range represented by the following Expression (3).

$$n_2 \leq n_3 \sin \theta_2 \qquad \text{Expression (1)}$$

$$\Delta u'v' = \sqrt{(u'(\theta_3) - u'(0))^2 + (v'(\theta_3) - v'(0))^2} \qquad \text{Expression (2)}$$

$$n_3 \sin \theta_2 - 0.1 \leq n_2 \leq n_3 \sin \theta_2 \qquad \text{Expression (3)}$$

Further, as a "fourth aspect", similarly to the first aspect, the angle $\theta_3$ is plotted along the horizontal axis and the change in chromaticity ($\Delta u'v'$) is plotted along the vertical axis to obtain a graph.

Figure 3:
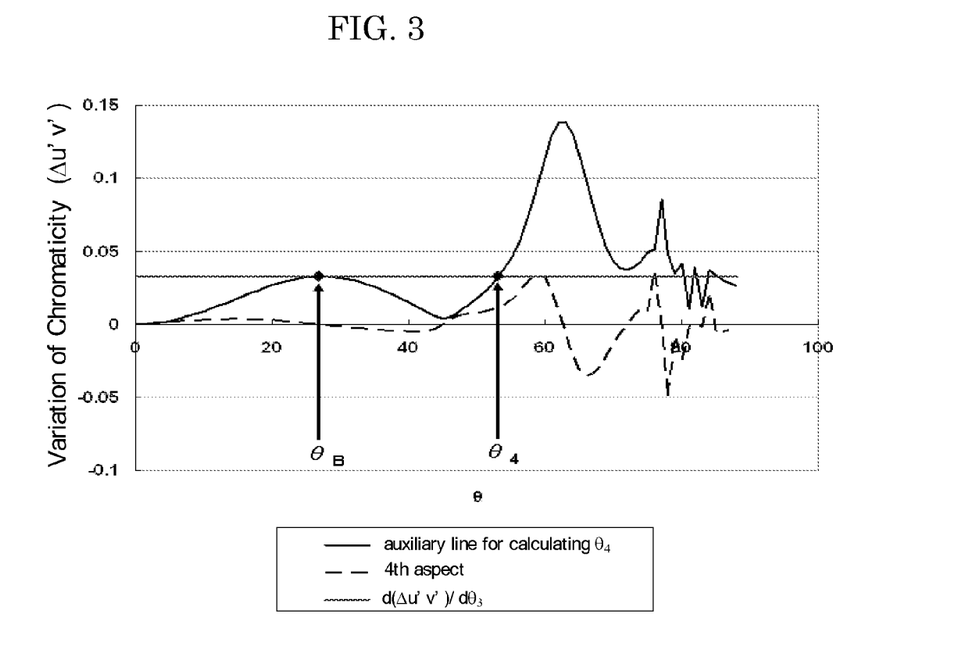
FIG. 3 is a diagram illustrating the method of calculating a real part $n_2$ of refractive index of a lens in an organic electroluminescent element according to the present invention.

Next, as illustrated in FIG. 3, in the graph with $\theta_3$ plotted along the horizontal axis and the change in chromaticity ($\Delta u'v'$) plotted along the vertical axis, the smallest angle at which the change in chromaticity ($\Delta u'v'$) is first-order differentiated with respect to $\theta_3$ ($\theta_3 \geqq 0$) to obtain $d(\Delta u'v')/d\theta_3$ and the value of $d(\Delta u'v')/d\theta_3$ is equal to zero ($d(\Delta u'v')/d\theta_3=0$) is determined. That is, the smallest angle at which the gradient of $\Delta u'v'(\theta_3)$ is zero is found, and this angle is defined as $\theta_B$.

Then, in the graph with $\theta_3$ plotted along the horizontal axis and the change in chromaticity ($\Delta u'v'$) plotted along the vertical axis, an angle, which has the same value as the change in chromaticity ($\Delta u'v'$) when the angle $\theta_3$ is equal to $\theta_B$, and has a large value next to $\theta_B$, is defined as $\theta_4$.

After having been subjected to the above procedure, the real part $n_2$ of refractive index of the lens A1 can be calculated by the following Expression (1)'.

In the fourth aspect, the lens A1 is not particularly limited, as long as the value of $n_2$ can be represented by the following Expression (1)', and may be suitably selected in accordance with the intended use. It is, however, preferable to use a lens having $n_2$ within the range represented by the following Expression (3)'.

$$n_2 \leqq n_3 \sin\theta_4 \qquad \text{Expression (1)'}$$

$$n_3 \sin\theta_4 - 0.1 \leqq n_2 \leqq n_3 \sin\theta_4 \qquad \text{Expression (3)'}$$

This corresponds to an increased optical quantity while the maximum value of color drift being kept at about a value of $\Delta u'v'(\theta B)$.

The method of measuring the chromaticity when the angle $\theta_3$ is varied from 0° to 90° is not particularly limited and may be suitably selected in accordance with the intended use. For example, a measuring method using an instrument, such as a spectrophotometer, a spectroradiometer and a spectral radiance meter, is exemplified. In addition to the above, values of chromaticity determined by an instrument are read to obtain a spectrum, and the above-mentioned chromaticity can also be calculated from the spectrum.

A lens having a real part $n_2$ of refractive index calculated according to the above procedure has a low refractive index as compared to a glass lens having a real part of a refractive index of about 1.8, which is used for extracting light as much as possible. Therefore, such a lens having a low refractive index is preferable in that light including components inferior in chromaticity is totally reflected without exiting from the organic electroluminescent element, and a difference in chromaticity can be reduced between a chromaticity when viewed from a plane perpendicular to the organic electroluminescent element and a chromaticity when viewed in an oblique direction with respect to the organic electroluminescent element.

The material for use in the lens is not particularly limited, as long as it is a material having a real part $n_2$ of refractive index satisfying the Expressions described above, and may be suitably selected in accordance with the intended use. Examples thereof include various glass materials, acrylic resins, epoxy resins, urethane resins, and silicone resins.

<Substrate>

The substrate is not particularly limited as to the shape, structure, size, etc., and may be suitably selected. In general, the substrate is preferably plate-shaped. The structure of the substrate may be a single layer structure or may be a lamination structure, and may consist of a single member or may be formed of two or more members. The substrate may be colorless and transparent, or may be colored and transparent, but from the viewpoint of not scattering or attenuating the light emitted from the organic light-emitting layer, a colorless and transparent substrate is preferably used.

The material for use in the substrate is not particularly limited and may be suitably selected in accordance with the intended use. Specific examples of materials of the substrate include inorganic materials (e.g., yttria stabilized zirconia (YSZ) and glass); and organic materials; polyester resins (e.g., polyethylene terephthalate resin, polybutylene phthalate resin, and polyethylene naphthalate); polystyrene resin, polycarbonate resin, polyether sulfone resin, polyallylate resin, polyimide resin, polycycloolefin resin, norbornene resin, and poly(chlorotrifluoroethylene) resin. These may be used alone or in combination.

For instance, when glass is used as the substrate, alkali-free glass is preferably used as the material for reducing elution of ions from the glass. Further, when soda lime glass is used, it is preferable to use the one provided with a barrier coat (barrier film substrate). In the case of organic materials, materials excellent in heat resistance, dimensional stability, solvent resistance, electrical insulating properties and processability are preferably used.

When a thermoplastic substrate using an organic material having heat resistance is used, if necessary, a hard coat layer and an undercoat layer may further be provided thereon.

<Barrier Layer>

The barrier layer is not particularly limited, as long as it has a function to prevent oxygen, moisture, nitrogen oxides, sulfur oxides, and ozone in the air from passing through the organic EL element, and may be suitably selected in accordance with the intended use.

The material for use in the barrier layer is not particularly limited and may be suitably selected in accordance with the intended use. Examples thereof include metals (e.g., In, Sn, Pb, Au, Cu, Ag, Al, Ti, and Ni); metal oxides (e.g., MgO, SiO, $SiO_2$, SiN, SiON, $Al_2O_3$, GeO, NiO, CaO, BaO, $Fe_2O_3$, $Y_2O_3$, and $TiO_2$); metal nitrides (e.g. $SiN_x$, and $SiN_xO_y$); metal fluorides (e.g., $MgF_2$, LiF, $AlF_3$, and $CaF_2$); copolymers of dichlorodifluoroethylene with polyethylene, polypropylene, polymethylmethcrylate, polyimide, polyurea, polytetrafluoroethylene, polychlorotrifluoroethylene, polydichlorodifluoroethylene, or chlorotrifluoroethylene; a copolymer obtained by copolymerization of tetrafluoroethylene with a monomer mixture containing at least one comonomer; a fluorine-containing copolymer having a cyclic structure in the main chain of the copolymer; water-absorptive materials having a water absorption of 1% or more; and moisture-resistant materials having a water absorption of 0.1% or less.

The thickness of the barrier layer is not particularly limited and may be suitably selected in accordance with the intended use. It is, however, preferably from 5 nm to 1,000 nm, more preferably from 7 nm to 750 nm, and particularly preferably from 10 nm to 500 nm. When the thickness of the barrier layer is less than 5 nm, the barrier function of preventing oxygen and moisture in the air from passing through the organic EL element may be insufficient. Whereas more than 1,000 nm, the transparency may be impaired due to a decrease in the light transmittance.

With respect to optical properties of the barrier layer, the light transmittance is preferably 80% or higher, more preferably 85% or higher, and still more preferably 90% or higher.

The method of forming the barrier layer is not particularly limited and may be suitably selected in accordance with the intended use. Examples thereof include a vacuum vapor deposition method, a sputtering method, a reactive sputtering method, MBE (molecular beam epitaxy) method, cluster-ion beam method, an ion-plating method, a plasma polymerization method (high-frequency excitation ion-plating method), a plasma CVD method, a laser CVD method, a thermal CVD method, a gas source CVD method, a coating method, a printing method and a transfer method.

<Driving>

The organic electroluminescence element can obtain light emission by applying a DC (if necessary, AC component may be contained) voltage (generally from 2 volts to 15 volts) between the anode and the cathode, or by applying a DC electric current therebetween.

As to the driving method of the organic electroluminescent element, the driving methods disclosed in Japanese Patent Application Laid-Open (JP-A) Nos. 02-148687, 06-301355, 05-29080, 07-134558, 08-234685, 08-241047, Japanese Patent (JP-B) No. 2784615, U.S. Pat. Nos. 5,828,429, and 6,023,308 can be applied to the present invention.

EXAMPLES

Hereinafter, the present invention will be further described in detail with reference to Examples of the present invention and Comparative Examples. However, the following Examples shall not be construed as limiting the present invention.

Comparative Example 1

Production of Organic Electroluminescent Element of BEM (m=2)

As a glass substrate, glass having a thickness of 0.2 mm (with a real part of a refractive index of 1.8) (produced by MATSUNAMI GLASS IND., LTD.) was used.

On the glass substrate, a glass material (with a real part of a refractive index of 1.8) (produced by MATSUNAMI GLASS IND., LTD.) was ground to form a convex lens in a semispherical shape and with a size so as to sufficiently cover pixels for the EL.

Next, on the opposite side surface of the glass substrate to the convex lens, Ag was formed by a vacuum vapor deposition so as to have a thickness of 20 nm.

Next, a hole injection layer was formed on the Ag film by vacuum depositing 2-TNATA and F4-TCNQ at a ratio of 100:1 so as to have a thickness of 120 nm.

Next, a first hole transport layer was formed on the hole injection layer by vacuum depositing α-NPD so as to have a thickness of 10 nm.

Next, a second hole transport layer was formed on the first hole transport layer by vacuum depositing HTM (hole transport material) represented by Structural Formula (I) so as to have a thickness of 3 nm.

Next, an organic light-emitting layer was formed on the second hole transport layer by vacuum co-depositing mCP [m-dicarbazole-benzene] (as a host material) and BEM (as a blue light-emitting material) at a ratio of 90:10 so as to have a thickness of 30 nm. Here, the blue light-emitting material has a PL spectrum (center wavelength: 455 nm; width: 40 nm), and the host material mCP has an average refractive index of 1.73 at a wavelength of 380 nm to 780 nm.

Next, a first electron transport layer was formed on the organic light-emitting layer by vacuum depositing BAlq so as to have a thickness of 39 nm.

Next, a second electron transport layer was formed on the first electron transport layer by vacuum depositing BCP so as to have a thickness of 1 nm.

Next, an electron injection layer was formed on the second electron transport layer by vacuum depositing LiF so as to have a thickness of 1 nm. Next, a cathode was formed on the electron injection layer by vacuum depositing aluminum (Al) so as to have a thickness of 100 nm.

Structural Formula (1)

In an organic electroluminescent element of Comparative Example 1, a perpendicular line was drawn from the light extracting surface thereof to the organic light-emitting layer, and an angle of light emitted from the organic light-emitting layer formed to the perpendicular line when the light passed through the convex lens was defined as $\theta_3$. Then, chromaticities obtained when $\theta_3$ was equal to 0° ($\theta_3$=0°) and when $\theta_3$ was changed with respect to the perpendicular line were measured by SR-3 (manufactured by TOPCON Corp.), and a change in chromaticity ($\Delta u'v'$) therebetween (i.e., a value obtained when $\theta_3$ was equal to 0°($\theta_3$=0°) and a value obtained when $\theta_3$ was changed with respect to the perpendicular line) was calculated by the following Expression (2). A graph with $\theta_3$ plotted along the horizontal axis and the change in chromaticity ($\Delta u'v'$) plotted along the vertical axis is illustrated in FIG. 4.

$$\Delta u'v' = \sqrt{(u'(\theta_3)-u'(0))^2 + (v'(\theta_3)-v'(0))^2} \qquad \text{Expression (2)}$$

Figure 4:
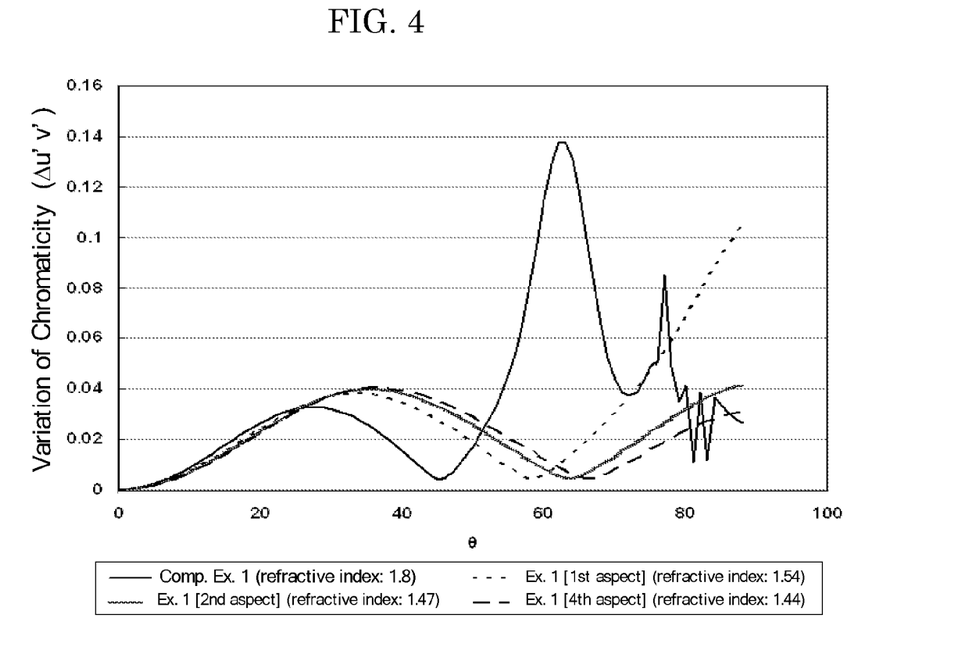
FIG. 4 is a graph exemplarily illustrating a relationship between a change in viewing angle (θ) and a change in chromaticity ($\Delta u'v'$) when "m" is equal to 2 (m=2) in two lenses each having a different real part of a refractive index, in two organic electroluminescent elements (BEM).

The result illustrated in FIG. 4 demonstrated that the organic electroluminescent element of Comparative Example 1, in which a convex lens (with a real part of a refractive index of 1.8) was formed on the glass substrate (with a real part of a refractive index of 1.8), had increased in the change in chromaticity when $\theta_3$ was formed from 40° toward 60°, an angle $\theta_3$ with respect to the change in chromaticity ($\Delta u'v'$) of 0.1 or less (determined from the first aspect) was 59° or less, and an angle $\theta$ with respect to the change in chromaticity ($\Delta u'v'$) of 0.05 or less (determined from the second aspect) was 55° or less. It was confirmed that when $\theta_3$ was greater than these angles, components inferior in chromaticity had increased. In addition, an angle $\theta$ of Comparative Example 1 with respect to the change in chromaticity ($\Delta u'v'$) of 0.02 or less (determined from the third aspect) was 16° or less.

A graph (FIG. 4) obtained using a convex lens (with a real part of a refractive index of 1.8, determined from the fourth aspect) was first-order differentiated [($\Delta u'v'$)/d$\theta_3$], and the smallest angle ($\theta_B$) obtained when the differentiated value became zero was found to be 27.5°. An angle ($\theta_4$) having the same value as the change in chromaticity ($\Delta u'v'$) corresponding to the angle of ($\theta_B$) and having a large value next to 27.5° ($\theta_B$) was found to be 53°.

Example 1

Production of Organic Electroluminescent Element of BEM (m=2)

A real part $n_2$ of refractive index of a lens for use in an organic electroluminescent element of Example 1 was calculated by the following Expression (1)', on the basis that the angle ($\theta_4$) was regarded as 53° (determined from the fourth aspect of Comparative Example 1) and a real part of a refractive index of the lens was 1.8.

$$n_2 \leq n_3 \sin \theta_4 \quad \text{Expression (1)'}$$

In Expression (1)', "$n_3$" represents a real part of the refractive index of the lens used to examine the change in chromaticity (in this case, real part: 1.8), and "$\theta_4$" represents an angle having the same value as the change in chromaticity ($\Delta u'v'$) corresponding to $\theta_B$ and having a large value next to $\theta_B$ (in this case, 53°. That is, the real part $n_2$ of the refractive index of the lens for use in the organic electroluminescent element of Example 1 is 1.44.

Then, as a glass substrate, glass having a thickness of 0.2 mm (with a real part of a refractive index of 1.8) (produced by MATSUNAMI GLASS IND., LTD.) was used, and an organic electroluminescent element was produced in the same procedure as in Comparative Example 1, except that a convex lens was formed on the glass substrate using SILPOT184 (with a real part of a refractive index of 1.44) (produced by TORAY Dow Corning Co., Ltd.) by an imprinting method so as to be sufficiently greater in size than pixels for the EL.

A perpendicular line was drawn from the light extracting surface of the organic electroluminescent element of Example 1 to the organic light-emitting layer, and an angle of light emitted from the organic light-emitting layer formed to the perpendicular line when the light passed through the convex lens was defined as θ3. Then, a change in chromaticity ($\Delta u'v'$) between a value obtained when $\theta_3$ was equal to 0° ($\theta_3=0$°) and a value obtained when $\theta_3$ was changed with respect to the perpendicular line was calculated by the following Expression (2). A graph with $\theta_3$ plotted along the horizontal axis and the change in chromaticity ($\Delta u'v'$) plotted along the vertical axis is illustrated in FIG. 4.

$$\Delta u'v' = \sqrt{(u'(\theta_3)-u'(0))^2 + (v'(\theta_3)-v'(0))^2} \quad \text{Expression (2)}$$

The result illustrated in FIG. 4 demonstrated that in the organic electroluminescent element of Example 1, in which a convex lens (with a real part of a refractive index of 1.44) was formed on the glass substrate (with a real part of a refractive index of 1.8), the change in chromaticity was on the level where there was no substantial damage in practical use even when $\theta_3$ was exceeding 53°, and could be suppressed to 0.04, in contrast to Comparative Example 1 where the change in chromaticity was observed up to 0.14, and the angle at which the change in chromaticity was becoming greater from the point of ($\theta_3=0$) could be remarkably shifted down.

FIG. 4 also illustrates the results of change in chromaticity of the organic electroluminescent element of Example 1 using a lens (with a real part of a refractive index of 1.54, which was calculated by Expression (1) described above, based on the condition of an angle of 59°, determined from the first aspect), and a lens (with a real part of a refractive index of 1.47, which was calculated by Expression (1), based on the condition of an angle of 55°, determined from the second aspect). Note that in the case of an angle A under the condition of employing an angle of 16° or less (determined from the third aspect), the real part of a refractive index of Example 1 was found to be 1 or less, and thus the result was not illustrated in FIG. 4.

Comparative Example 2

Production of Organic Electroluminescent Element of GEM (m=2)

As a glass substrate, glass having a thickness of 0.2 mm (with a real part of a refractive index of 1.8) (produced by MATSUNAMI GLASS IND., LTD.) was used.

On the glass substrate, a glass material (with a real part of a refractive index of 1.8) (produced by MATSUNAMI GLASS IND., LTD.) was ground to form a convex lens in a semispherical shape and with a size so as to sufficiently cover pixels for the EL.

Next, on the opposite side surface of the glass substrate to the convex lens, Ag was formed by a vacuum vapor deposition so as to have a thickness of 20 nm.

Next, a hole injection layer was formed on the Ag film by vacuum depositing 2-TNATA and F4-TCNQ at a ratio of 100:1 so as to have a thickness of 160 nm.

Next, a first hole transport layer was formed on the hole injection layer by vacuum depositing α-NPD so as to have a thickness of 10 nm.

Next, a second hole transport layer was formed on the first hole transport layer by vacuum depositing HTM (hole transport material) represented by Structural Formula (1) described above so as to have a thickness of 3 nm.

Next, an organic light-emitting layer was formed on the second hole transport layer by vacuum co-depositing mCP (as a host material) and GEM (as a green light-emitting material) at a ratio of 85:15 so as to have a thickness of 30 nm. Here, the green light-emitting material (GEM) has a PL spectrum (center wavelength: 505 nm; width: 50 nm).

Next, a first electron transport layer was formed on the organic light-emitting layer by vacuum depositing BAlq so as to have a thickness of 39 nm.

Next, a second electron transport layer was formed on the first electron transport layer by vacuum depositing BCP so as to have a thickness of 1 nm.

Next, an electron injection layer was formed on the second electron transport layer by vacuum depositing LiF so as to have a thickness of 1 nm. Next, a cathode was formed on the electron injection layer by vacuum depositing aluminum (Al) so as to have a thickness of 100 nm.

A perpendicular line was drawn from the light extracting surface of the organic electroluminescent element of Comparative Example 2 to the organic light-emitting layer, and an angle of light emitted from the organic light-emitting layer formed to the perpendicular line when the light passed through the convex lens was defined as $\theta_3$. Then, chromaticities obtained when $\theta_3$ was equal to 0° ($\theta_3=0$°) and when $\theta_3$ was changed with respect to the perpendicular line were measured by SR-3 (manufactured by TOPCON Corp.), and a change in chromaticity ($\Delta u'v'$) therebetween was calculated by the following Expression (2). A graph with $\theta_3$ plotted along the horizontal axis and the change in chromaticity ($\Delta u'v'$) plotted along the vertical axis is illustrated in FIG. 5.

$$\Delta u'v' = \sqrt{(u'(\theta_3)-u'(0))^2 + (v'(\theta_3)-v'(0))^2} \quad \text{Expression (2)}$$

Figure 5:
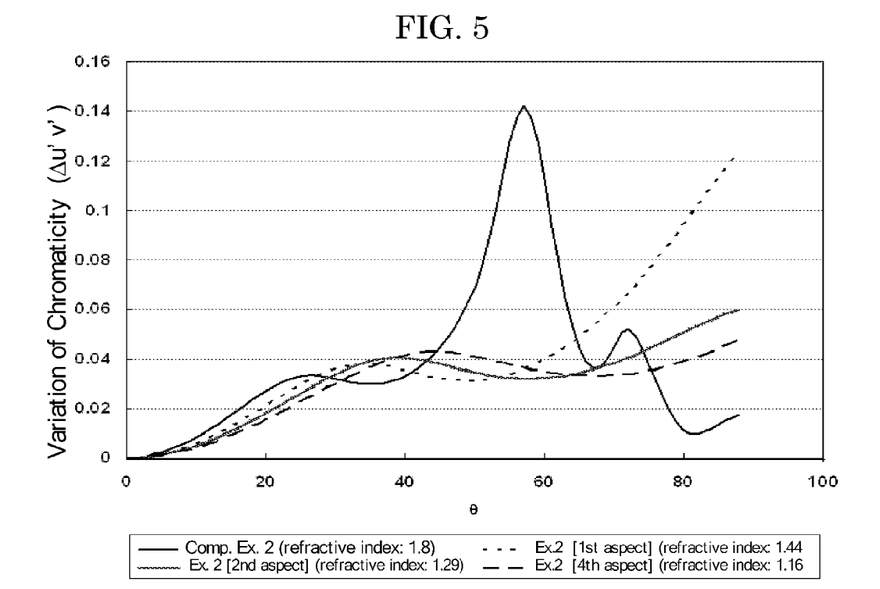
FIG. 5 is a graph exemplarily illustrating a relationship between a change in viewing angle (θ) and a change in chromaticity ($\Delta u'v'$) when "m" is equal to 2 (m=2) in two lenses each having a different real part of a refractive index, in two organic electroluminescent elements (GEM).

The result illustrated in FIG. 5 demonstrated that the organic electroluminescent element of Comparative Example 2, in which a convex lens (with a real part of a refractive index of 1.8) was formed on the glass substrate (with a real part of a refractive index of 1.8), had increased in the change in chromaticity when $\theta_3$ was formed from 40° toward 60°, an angle $\theta_3$ with respect to the change in chromaticity ($\Delta u'v'$) of 0.1 or less (determined from the first aspect) was 53° or less and an angle $\theta_3$ with respect to the change in chromaticity ($\Delta u'v'$) of 0.05 or less (determined from the second aspect) was 46° or less. It was confirmed that when $\theta_3$ was greater than these angles, components inferior in chromaticity had increased. In addition, an angle $\theta$ of Comparative Example 2 with respect to the change in chromaticity ($\Delta u'v'$) of 0.02 or less (determined from the third aspect) was 16° or less.

A graph (in FIG. 5) obtained using a convex lens (with a real part of a refractive index of 1.8, determined from the fourth aspect) was first-order differentiated [($\Delta u'v'$)/$d\theta_3$], and the smallest angle ($\theta_B$) obtained when the differentiated value became zero was found to be 26.5°. An angle ($\theta_4$) having the same value as the change in chromaticity ($\Delta u'v'$) corresponding to $\theta_B$ and having a large value next to 26.5° ($\theta_B$) was found to be 40°.

Example 2

Production of Organic Electroluminescent Element of GEM (m=2))

A real part $n_2$ of refractive index of a lens for use in an organic electroluminescent element of Example 2 was calculated by the following Expression (1), on the basis that an angle ($\theta_2$) at which the change in chromaticity became greater than 0.1 was regarded as 53° (determined from the first aspect of Comparative Example 1) and a real part of a refractive index of the lens was 1.8.

$$n_2 \leq n_3 \sin \theta_2 \quad \text{Expression (1)}$$

In Expression (1), "$n_2$" represents a real part of the refractive index of the organic light-emitting layer (in this case, real part: 1.8), and "$\theta_2$" represents an angle at which the change in chromaticity becomes greater than 0.1 (in this case, 53°). That is, the real part $n_2$ of refractive index of the lens for use in the organic electroluminescent element of Example 2 is 1.44.

Then, as a glass substrate, glass having a thickness of 0.2 mm (with a real part of a refractive index of 1.8) (produced by MATSUNAMI GLASS IND., LTD.) was used, and an organic electroluminescent element was produced in the same procedure as in Comparative Example 2, except that a convex lens was formed on the glass substrate using SILPOT184 (with a real part of a refractive index of 1.44) (produced by TORAY Dow Corning Co., Ltd.) so as to be sufficiently greater in size than pixels for the EL.

A perpendicular line was drawn from the light extracting surface of the organic electroluminescent element of Example 2 to the organic light-emitting layer, and an angle of light emitted from the organic light-emitting layer formed to the perpendicular line when the light passed through the convex lens was defined as $\theta_3$. Then, a change in chromaticity ($\Delta u'v'$) between a value obtained when $\theta_3$ was equal to 0° ($\theta_3=0°$) and a value obtained when $\theta_3$ was changed with respect to the perpendicular line was calculated by the following Expression (2). A graph with $\theta_3$ plotted along the horizontal axis and the change in chromaticity ($\Delta u'v'$) plotted along the vertical axis is illustrated in FIG. 5.

$$\Delta u'v' = \sqrt{(u'(\theta_3)-u'(0))^2 + (v'(\theta_3)-v'(0))^2} \quad \text{Expression (2)}$$

The result illustrated in FIG. 5 demonstrated that the organic electroluminescent element of Example 2, in which a convex lens (with a real part of a refractive index of 1.44) was formed on the glass substrate (with a real part of a refractive index of 1.8) had less change in chromaticity to the angle $\theta_3$ of 60° even when $\theta_3$ was exceeding 40°, and the angle at which the change in chromaticity was becoming greater from the point of ($\theta_3=0$) could be remarkably shifted down.

FIG. 5 also illustrates the results of change in chromaticity of the organic electroluminescent element of Example 2 using a lens (with a real part of a refractive index of 1.29, which was calculated by Expression (1) described above, based on the condition of an angle of 46°, determined from the second aspect), and a lens (with a real part of a refractive index of 1.16, which was calculated by Expression (1), based on the condition of an angle of 40°, determined from the fourth aspect) by a calculator.

Comparative Example 3

Production of Organic Electroluminescent Element of GEM (m=1)

As a glass substrate, glass having a thickness of 0.2 mm (with a real part of a refractive index of 1.8) (produced by MATSUNAMI GLASS IND., LTD.) was used.

On the glass substrate, a glass material (with a real part of a refractive index of 1.8) (produced by MATSUNAMI GLASS IND., LTD.) was ground to form a convex lens in a semispherical shape and with a size so as to sufficiently cover pixels for the EL.

Next, on the opposite side surface of the glass substrate to the convex lens, Ag was formed by a vacuum vapor deposition so as to have a thickness of 20 nm.

Next, a hole injection layer was formed on the Ag film by vacuum depositing 2-TNATA and F4-TCNQ at a ratio of 100:1 so as to have a thickness of 20 nm.

Next, a first hole transport layer was formed on the hole injection layer by vacuum depositing α-NPD so as to have a thickness of 10 nm.

Next, a second hole transport layer was formed on the first hole transport layer by vacuum depositing HTM (hole transport material) represented by Structural Formula (1) described above so as to have a thickness of 3 nm.

Next, an organic light-emitting layer was formed on the second hole transport layer by vacuum co-depositing CBP [4,4'-bis-(N-carbazole)biphenyl] (as a host material) and GEM (as a green light-emitting material) at a ratio of 85:15 so as to have a thickness of 30 nm. Here, the green light-emitting material (GEM) is the same one as used in Comparative Example 2.

Next, a first electron transport layer was formed on the organic light-emitting layer by vacuum depositing BAlq so as to have a thickness of 39 nm.

Next, a second electron transport layer was formed on the first electron transport layer by vacuum depositing BCP so as to have a thickness of 1 nm.

Next, an electron injection layer was formed on the second electron transport layer by vacuum depositing LiF so as to have a thickness of 1 nm. Next, a cathode was formed on the electron injection layer by vacuum depositing aluminum (Al) so as to have a thickness of 100 nm.

A perpendicular line was drawn from the light extracting surface of the organic electroluminescent element of Comparative Example 3 to the organic light-emitting layer, and an angle of light emitted from the organic light-emitting layer formed to the perpendicular line when the light passed through the convex lens was defined as $\theta_3$. Then, chromaticities obtained when $\theta_3$ was equal to 0° ($\theta_3=0°$) and when $\theta_3$ was changed with respect to the perpendicular line were measured by SR-3 (manufactured by TOPCON Corp.), and a change in chromaticity ($\Delta u'v'$) therebetween was calculated by the following Expression (2). A graph with $\theta_3$ plotted along the horizontal axis and the change in chromaticity (Δu'v') plotted along the vertical axis is illustrated in FIG. 6.

$$\Delta u'v' = \sqrt{(u'(\theta_3)-u'(0))^2+(v'(\theta_3)-v'(0))^2} \quad \text{Expression (2)}$$

Figure 6:
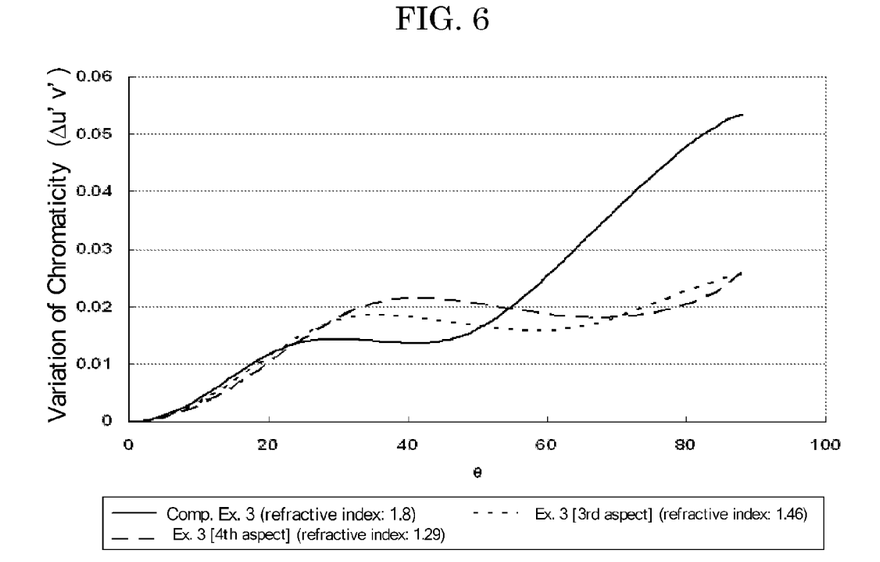
FIG. 6 is a graph exemplarily illustrating a relationship between a change in viewing angle (θ) and a change in chromaticity ($\Delta u'v'$) when "m" is equal to 1 (m=1) in two lenses each having a different real part of a refractive index, in two organic electroluminescent elements (GEM).

The result illustrated in FIG. 6 demonstrated that the organic electroluminescent element of Comparative Example 3, in which a convex lens (with a real part of a refractive index of 1.8) was formed on the glass substrate (with a real part of a refractive index of 1.8), had increased in the change in chromaticity when $\theta_3$ was exceeding 55°, an angle $\theta_3$ with respect to the change in chromaticity (Δu'v') of 0.05 or less (determined from the second aspect) was 82° or less and an angle $\theta_3$ with respect to the change in chromaticity (Δu'v') of 0.02 or less (determined from the third aspect) was 54° or less.

Further, a graph (FIG. 6) obtained using a convex lens (with a real part of a refractive index of 1.8, determined from the fourth aspect) was first-order differentiated [(Δu'v')/dθ$_3$], and the smallest angle ($\theta_B$) obtained when the differentiated value became zero was found to be 30°. An angle ($\theta_4$) having the same value as the change in chromaticity (Δu'v') corresponding to the smallest angle $\theta_B$ and having a large value next to 30° ($\theta_B$) was found to be 46°.

Example 3

Production of Organic Electroluminescent Element of GEM (m=1)

A real part $n_2$ of refractive index of a lens for use in an organic electroluminescent element of Example 3 was calculated by the following Expression (1), on the basis that an angle ($\theta_2$) at which the change in chromaticity became greater was regarded as 54° (determined from the third aspect of Comparative Example 3) and a real part of a refractive index of the lens was 1.8.

$$n_2 \leq n_3 \sin \theta_2 \quad \text{Expression (1)}$$

In Expression (1), "$n_3$" represents a real part of the refractive index of the lens used to examine the change in chromaticity (in this case, real part: 1.8), and "$\theta_2$" represents a viewing angle at which the change in chromaticity becomes greater than 0.02 (in this case, 55°). That is, the real part $n_2$ of the refractive index of the lens for use in the organic electroluminescent element of Example 3 is 1.46.

Then, as a glass substrate, glass having a thickness of 0.2 mm (with a real part of a refractive index of 1.8) (produced by MATSUNAMI GLASS IND., LTD.) was used, and an organic electroluminescent element was produced in the same procedure as in Comparative Example 3, except that a convex lens formed of quartz glass (with a real part of a refractive index of 1.46, which is different from that of the glass substrate) was formed on the glass substrate.

A perpendicular line was drawn from the light extracting surface of the organic electroluminescent element of Example 3 to the organic light-emitting layer, and an angle of light emitted from the organic light-emitting layer formed to the perpendicular line when the light passed through the convex lens was defined as $\theta_3$. Then, a change in chromaticity (Δu'v') between a value obtained when $\theta_3$ was equal to 0° ($\theta_3$=0°) and a value obtained when $\theta_3$ was changed with respect to the perpendicular line was calculated by the following Expression (2). A graph with $\theta_3$ plotted along the horizontal axis and the change in chromaticity (Δu'v') plotted along the vertical axis is illustrated in FIG. 6.

$$\Delta u'v' = \sqrt{(u'(\theta_3)-u'(0))^2+(v'(\theta_3)-v'(0))^2} \quad \text{Expression (2)}$$

The broken lines illustrated in FIG. 6 demonstrated that in the organic electroluminescent element of Example 3, in which a convex lens (with a real part of a refractive index of 1.46) was formed on the glass substrate (with a real part of a refractive index of 1.8), the change in chromaticity was on the level where there was no substantial damage in practical use even when $\theta_3$ was exceeding 55°, and could be suppressed to about 0.025, in contrast to Comparative Example 3 where the change in chromaticity varied by 0.05 or more.

FIG. 6 also illustrates the results of change in chromaticity of the organic electroluminescent element of Example 3 using a lens (with a real part of a refractive index of 1.29, which was calculated by Expression (1) described above, based on the condition of an angle of 46°, determined from the fourth aspect), using a calculator.

Values of each angle and each real part of a refractive index of organic electroluminescent elements of Examples 1 to 3 calculated based on the first aspect to the fourth aspect are collectively shown in Table 1 below.

TABLE 1

| | First aspect | | Second aspect | | Third aspect | | Fourth aspect | |
|---|---|---|---|---|---|---|---|---|
| | angle (°) | refractive index | angle (°) | refractive index | angle (°) | refractive index | angle (°) | refractive index |
| Ex. 1 | 59 | 1.54 | 55 | 1.47 | 16 | 0.50 | 53 | 1.44 |
| Ex. 2 | 53 | 1.44 | 46 | 1.29 | 16 | 0.50 | 40 | 1.16 |
| Ex. 3 | — | — | 82 | 1.78 | 54 | 1.46 | 46 | 1.29 |

Industrial Applicability

The organic electroluminescent element of the present invention has high-light extracting efficiency and less viewing angle dependency of chromaticity, and thus it can be suitably used in display devices, and the like.

What is claimed is:

1. An organic electroluminescent element comprising:
at least a pair of electrodes,
at least one organic light-emitting layer between the pair of electrodes, and
at least one lens A on a light-extracting surface of the pair of electrodes,
wherein one of the pair of electrodes is a reflective electrode, and the other is a semi-transmissive/semi-reflective electrode, and
wherein a real part $n_1$ of a refractive index of the organic light-emitting layer and a real part $n_2$ of a refractive index of the lens A satisfy the relationship $n_1 > n_2$, and the real part $n_2$ is represented by Expression (1) described below:

$$n_2 \leq n_3 \sin \theta_2 \quad \text{Expression (1)}$$

in Expression (1), $n_3$ represents a real part of a refractive index of a lens B having a different refractive index from the lens A; $n_3$ and $n_1$ satisfy the relationship $n_3 > n_1$; and $\theta_2$ represents the smallest angle at which when the lens A in the organic electroluminescent element is replaced by the lens B, a perpendicular line is drawn from the light extracting surface to the organic light-emitting layer, light emerged from the organic light-emitting layer passes through the lens B at an angle of $\theta_3$ with respect to the perpendicular line, and a change in chromaticity (Δu'v') between the angle of $\theta_3$ and the case where $\theta_3$ is equal to 0° on an u'v' chromaticity coordinate is represented by Expression (2) described below, the change in chromaticity ($\Delta u'v'$) is 0.1 or less $$\Delta u'v' = \sqrt{(u'(\theta_3)-u'(0))^2+(v'(\theta_3)-v'(0))^2}. \quad \text{Expression (2)}$$

2. The organic electroluminescent element according to claim 1, wherein the real part $n_2$ of the refractive index of the lens A satisfies Expression (3) described below:

$$n_3 \sin\theta_2 - 0.1 \leq n_2 \leq n_3 \sin\theta_2. \quad \text{Expression (3)}$$

3. The organic electroluminescent element according to claim 1, wherein when a distance between the pair of electrodes is represented by "d", a range of wavelengths about the peak intensity of light emitted from the organic light-emitting layer ±20 nm is represented by $\lambda$, and a phase shift of light reflected between the pair of electrodes is represented by $\phi$, the distance d, the range of wavelengths $\lambda$ and the phase shift $\phi$ satisfy Expression (4) described below and the relationship m≧2:

$$m = \frac{2d}{\lambda} + \frac{\phi}{2\pi} \quad \text{Expression (4)}$$

where "m" is an integer.

4. An organic electroluminescent element comprising:
at least a pair of electrodes,
at least one organic light-emitting layer between the pair of electrodes, and
at least one lens A on a light-extracting surface of the pair of electrodes,
wherein one of the pair of electrodes is a reflective electrode, and the other is a semi-transmissive/semi-reflective electrode, and
wherein a real part $n_1$ of a refractive index of the organic light-emitting layer and a real part $n_2$ of a refractive index of the lens A satisfy the relationship $n_1 > n_2$, and the real part $n_2$ is represented by Expression (1)' described below:

$$n_2 \leq n_3 \sin\theta_4 \quad \text{Expression (1)'}$$

in Expression (1)', $n_3$ represents a real part of a refractive index of a lens B having a different refractive index from the lens A; $n_3$ and $n_1$ satisfy the relationship $n_3 > n_1$; and $\theta_4$ represents an angle obtained when the lens A in the organic electroluminescent element is replaced by the lens B, a perpendicular line is drawn from the light extracting surface to the organic light-emitting layer, light emerged from the organic light-emitting layer passes through the lens B at an angle of $\theta_3$ with respect to the perpendicular line, a change in chromaticity ($\Delta u'v'$) between the angle of $\theta_3$ and the case where $\theta_3$ is equal to 0° on an u'v' chromaticity coordinate is represented by Expression (2) described below, and an angle at which a differential value when the change in chromaticity ($\Delta u'v'$) is differentiated with respect to $\theta_3$ d($\Delta u'v'$)/d$\theta_3$ is equal to zero is defined as $\theta_B$, and $\theta_4$ has the same value as the change in chromaticity ($\Delta u'v'$) corresponding to $\theta_B$ and has a large value next to $\theta_B$ $$\Delta u'v' = \sqrt{(u'(\theta_3)-u'(0))^2+(v'(\theta_3)-v'(0))^2}. \quad \text{Expression (2)}$$

5. The organic electroluminescent element according to claim 4, wherein the real part $n_2$ of the refractive index of the lens A satisfies Expression (3)' described below:

$$n_3 \sin\theta_4 - 0.1 \leq n_2 \leq n_3 \sin\theta_4. \quad \text{Expression (3)'}$$

6. The organic electroluminescent element according to claim 4, wherein when a distance between the pair of electrodes is represented by "d", a range of wavelengths about the peak intensity of light emitted from the organic light-emitting layer ±20 nm is represented $\lambda$, and a phase shift of light reflected between the pair of electrodes is represented by $\phi$, the distance d, the range of wavelengths $\lambda$ and the phase shift $\phi$ satisfy Expression (4) described below and the relationship m≧2:

$$m = \frac{2d}{\lambda} + \frac{\phi}{2\pi} \quad \text{Expression (4)}$$

in Expression (4), "m" is an integer.

* * * * *